US009478508B1

(12) United States Patent
LaRoche et al.

(10) Patent No.: US 9,478,508 B1
(45) Date of Patent: Oct. 25, 2016

(54) MICROWAVE INTEGRATED CIRCUIT (MMIC) DAMASCENE ELECTRICAL INTERCONNECT FOR MICROWAVE ENERGY TRANSMISSION

(71) Applicant: Raytheon Company, Waltham, MA (US)

(72) Inventors: Jeffrey R. LaRoche, Austin, TX (US); John P. Bettencourt, Danvers, MA (US); Thomas E. Kazior, Sudbury, MA (US); Kelly P. Ip, Lowell, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/733,465

(22) Filed: Jun. 8, 2015

(51) Int. Cl.
*H01L 23/66* (2006.01)
*H01L 23/528* (2006.01)
*H01L 23/532* (2006.01)

(52) U.S. Cl.
CPC ............ *H01L 23/66* (2013.01); *H01L 23/528* (2013.01); *H01L 23/5329* (2013.01); *H01L 23/53238* (2013.01); *H01L 2223/6627* (2013.01); *H01L 2223/6683* (2013.01)

(58) Field of Classification Search
CPC ................. H01L 23/66; H01L 23/528; H01L 23/53238; H01L 23/5329; H01L 2223/6627; H01L 2223/6683
USPC ....................................................... 257/664
See application file for complete search history.

(56) References Cited

U.S. PATENT DOCUMENTS

| 5,646,450 | A | 7/1997 | Liles et al. |
| 6,342,733 | B1 | 1/2002 | Hu et al. |
| 7,259,090 | B2 | 8/2007 | Wu et al. |
| 2003/0122175 | A1* | 7/2003 | Buskirk ............... H01L 23/5223 257/310 |
| 2004/0173910 | A1* | 9/2004 | Usami ............... H01L 21/76829 257/762 |
| 2009/0224369 | A1* | 9/2009 | Gamble ............ H01L 21/76254 257/616 |
| 2009/0284331 | A1 | 11/2009 | Pruvost et al. |
| 2010/0141354 | A1* | 6/2010 | Cho .......................... H01P 3/06 333/160 |
| 2014/0183739 | A1 | 7/2014 | Li et al. |

OTHER PUBLICATIONS

Annabelle Pratt, Ph.D., Inc. Overview of the Use of Copper Interconnects in the Semiconductor Industry, Advanced Energy Industry, Inc., pp. 1-20.

* cited by examiner

*Primary Examiner* — Fernando L Toledo
*Assistant Examiner* — Adam S Bowen
(74) *Attorney, Agent, or Firm* — Daly, Crowley, Mofford & Durkee, LLP (57) ABSTRACT

A semiconductor structure having a semiconductor layer having an active device therein. A dielectric structure is disposed over the semiconductor layer, such dielectric structure having open ended trench therein. An electrical interconnect level is disposed in the trench and electrically connected to the active device. A plurality of stacked metal layers is disposed in the trench. The stacked metal layers have disposed on bottom and sidewalls thereof conductive barrier metal layers.

8 Claims, 11 Drawing Sheets

1) Via pattern and etch

*FIG. 3A*

2) Deposit conductive Barrier material

*FIG. 3B*

3) Copper plate and Chemical mechanical polish

*FIG. 3C*

4) Via after CMP

*FIG. 3D*

5) Deposit first etch stop and oxide for layered copper line, photo define and etch

*FIG. 3E*

6) Deposit conductive Barrier metal

9) Deposit 2nd etch stop and oxide for layered copper line

*FIG. 3I*

10) Photo define etch, deposit conductive barrier, cmp and plate 2nd composite layer

*FIG. 3J*

11) Deposit 3rd etch stop and oxide for layered copper line

*FIG. 3K*

12) Repeat step 10, finished 3 layer composite line

MICROWAVE INTEGRATED CIRCUIT (MMIC) DAMASCENE ELECTRICAL INTERCONNECT FOR MICROWAVE ENERGY TRANSMISSION

TECHNICAL FIELD

This disclosure relates generally to monolithic microwave integrated circuits and more particularly to high power microwave transmission lines structures used in such circuits.

BACKGROUND AND SUMMARY

Over the last decade gallium nitride (GaN) high electron mobility transistors (HEMTs) have developed rapidly for use in power electronics and high power, high frequency (generally referred to as Radio Frequency (RF)) applications. In high power, high frequency applications, Monolithic Microwave Integrated Circuit (MMICs) have demonstrated power amplifiers (PAs) and low noise amplifiers (LNAs) with excellent characteristics at frequencies ranging from S-band to W-band and beyond. In general, the GaN PAs exhibit gain and efficiencies equivalent to GaAs PAs at ≥5 times the power density and often with very large output peripheries. This combination of power density and periphery in turn leads to MMICs with very large total output power.

The high power density and total output power have posed reliability challenges (electrical and thermal) that have had to be solved at the material, device, on-chip interconnect, and module levels. Compound semiconductor foundries have spent the last decade addressing these issues largely successfully. In the case of on-chip interconnect (metal wiring), for instance, electro-migration resistant gold (Au) based transmission line fabrication processes have had to be developed for demanding continuous wave (CW) and pulsed high power RF applications.

However, as GaN device technology matures and proliferates into commercial and defense markets, cost reduction efforts will become increasingly more important. To that end, manufacturing GaN devices in a silicon (Si) foundry with high yield subtractive processes, large diameter wafers, and a (Moore's law based) culture of rapid development is a natural evolutionary path for the technology. However, gold (Au) based wiring schemes are not compatible with silicon foundries due to both the high cost of Au and the fact that Au is essentially a contaminant in Si CMOS based processes. Instead of Au, advanced silicon foundries use copper (Cu) interconnect technology. As a result, new approaches will be needed to prevent electro-migration induced failures in copper (Cu) interconnects for high power RF MMICs.

As is known in the art, copper-based digital integrated circuit chips typically use copper interconnects because copper (Cu) is a better conductor than aluminum (Al). A secondary benefit, however, is that Cu is more resistant to electro-migration. Electro-migration, the process by which a metal conductor changes shape under the influence of an electric current flowing through it (and which eventually leads to the breaking of the conductor), is significantly better with copper than with aluminum (another metal option typically available in silicon foundries). This improvement in electro-migration resistance allows higher currents to flow through a given size copper conductor compared to aluminum. However, copper requires a different method for patterning than aluminum because the lack of volatile copper compounds stifles plasma dry etching of Cu metal lines for interconnects. Therefore, the patterning of the copper is done using an additive patterning process, sometimes referred to as "Damascene" or "dual-Damascene" process by analogy to a traditional technique of inlying metal into a host material, see U.S. Pat. Nos. 6,342,733 and 7,259,090 and U. S. Patent Application Publication No. 2014/0183739. Still more particularly, in this process, a host insulator material for the copper, typically an underlying insulating layer, is patterned with open trenches where the copper is to be formed. A thick coating of copper that significantly overfills the trenches is deposited on the insulating layer, and chemical-mechanical planarization (CMP) is used to remove the excess copper that extends above the top of the insulating layer. Copper sunken within the trenches of the insulating layer is not removed and becomes the patterned conductive interconnect.

Damascene processes generally form and fill a single feature with copper per Damascene level (or stage) of the metal interconnect (which may be disposed as horizontal trenches or vertical vias). For the single Damascene variant of Back End of Line (BEOL) circuit fabrication, this proceeds using a base dielectric stack having a silicon nitride (SiNx) etch stop (to limit metal interconnect trench depth) and silicon oxide (SiOx in which trenches are formed) followed by diffusion barrier and Cu deposition into the trenches and Cu CMP (as outlined above). It is noted that the SiNx and SiOx layers have compositions with x>0. The process then repeats to facilitate multilevel interconnect formation.

Dual-Damascene processes generally form and fill two features with copper at once, e.g., a trench overlying a via level (or stage) of the electrical interconnect structure may both be filled with a single copper deposition using dual-Damascene. Thus, with a dual Damascene process interconnect the level or stage and the via level or stage of the electrical interconnect structures are formed with one fill of copper. A barrier metal layer must completely surround all copper interconnections, since diffusion of copper into surrounding materials would degrade their properties. As the name implies, a barrier metal must limit copper diffusivity sufficiently to chemically isolate the copper conductor from the insulating material below, yet have high electrical conductivity in order to maintain a good electronic contact. The barrier layer also must act as an adhesion layer between the Cu and underlying dielectric and metal layers.

Figure 1:
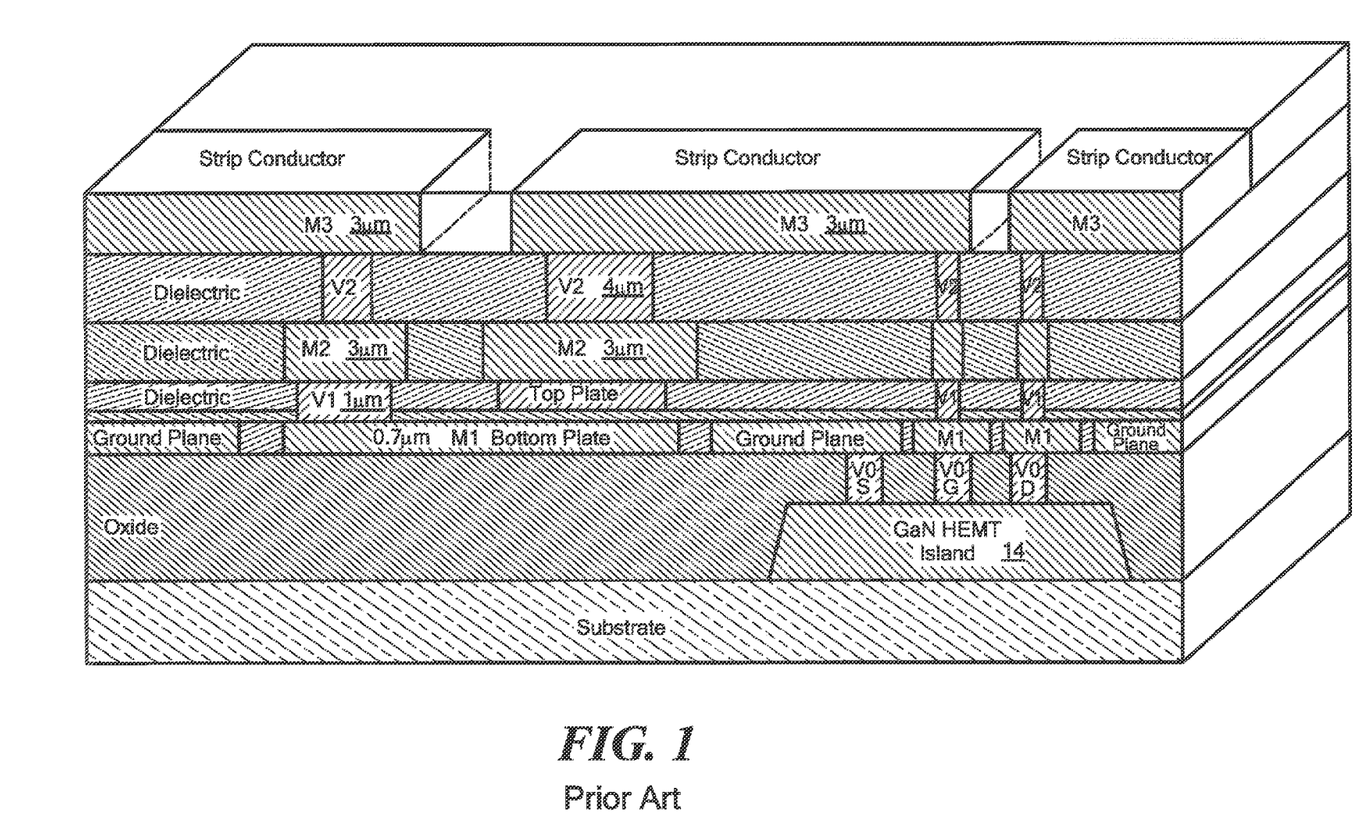
FIG. 1 is a cross-sectional, perspective sketch of an MMIC chip according to the PRIOR ART.

As is also known in the art, while copper metallization utilizing Damascene processing has become the dominant interconnection processing in manufacturing digital and other relatively low power integrated circuits (ICs). Damascene processing has also been used in the fabrication of RF amplifier power circuits having electrical interconnects such as, microwave transmission lines, for the RF transistors and passive matching structures of a Monolithic Microwave Integrated Circuit (MMIC). One such MMIC Damascene electrical interconnect structure is shown in FIG. 1. Here, for example, microwave energy is fed through an input microwave transmission line, here a strip transmission line having a strip conductor separated from a ground plane conductor by a dielectric structure, to the gate electrode (G) of an amplifier GaN FET through a capacitor, here for example, a Metal Insulator Metal (MIM) capacitor; the FET having a grounded source electrode (S); the drain electrode (D) being coupled to an output microwave transmission, here a strip transmission line having a strip conductor separated from a ground plane conductor by a dielectric structure, as indicated. The following paragraphs outline the generalized formation of a MMIC employing single Damascene Cu BEOL formation.

After formation of gate (G), source (S), and drain (D) of the core transistor, the transistor is covered with the Damascene base dielectric stack (typically silicon nitride (SiN) etch stop and silicon oxide ($SiO_x$) as mentioned previously) and back end of line (BEOL) formation of the integrated circuit (IC) proceeds, FIG. 1. The first via level (V0) is formed in the base dielectric stack to provide electrical connection to the first metal level M1. Next, another base dielectric stack is deposited and used to form the first metal level M1 providing the ground plane conductor, the bottom plate of the capacitor. Next, another base dielectric stack is deposited for and the capacitor top and Via 1 are formed and then metallized concurrently. This is then followed by the deposition of another base dielectric stack and formation of the second metal layer M2. It is noted that V1 provides: the upper plate for the capacitor; provides a portion of the connection between the strip conductor of the input microwave transmission line and the bottom plate of the capacitor; provides a portion of the connection between the gate electrode (G) and the top plate of the capacitor; and provides a portion of the connection between the drain (D) electrode and the strip conductor of the output microwave transmission line. The process continues with the next base dielectric layer stack with open vias to form via V2. This in turn followed another base dielectric stack and trench formation and metal deposition to form the third metal layer M3. It is noted that V2 provides: a portion of the connection between the strip conductor of the input microwave transmission line and the bottom plate of the capacitor; provides a portion of the connection between the gate electrode (G) and the top plate of the capacitor, and provides a portion of the connection between the drain (D) electrode and the strip conductor of the output microwave transmission line. The third metal layer provides the strip conductors, as shown.

It should be noted that other passive devices, not shown, such as thin film resistors and spiral inductors may be formed using the metal levels M2 and M3. Furthermore different circuit topologies (such as GaN MMICs integrated with Si CMOS circuits by wafer bonding) may require more or less levels of metal than are shown here. Finally, after final metal deposition, SiNx and SiOx capping layer depositions are typically performed followed by final interconnect formation for packaging or test.

The inventors have recognized that one of the reasons for using upper level metals for passive RF circuitry is they are typically the thickest metals formed during Damascene process, for example, 3 microns thick. With these thicker metals, RF or microwave transmission line loss can be lower in addition to handling high power when compared to the lower thinner metals. For example in RF power amplifier IC's the AC power output of several transistors will typically be combined to a single point before going off chip. This power combining is achieved by joining several microwave transmission lines. This thick metal interconnect layer or level (the microwave transmission lines) for level (or stage) M3 is typically 3 to 7 microns thick of un-interrupted copper bounded by the barrier layer used in the Damascene process on the bottom and top of metal for stage or level M3. One reason being that the thickest available un-interrupted bulk conductor of the metal interconnect layer will handle the most power will reduce the chances of high power microwave transmission line failure.

As is also known in the art, one type of photolithgraphically formed MMIC conductor is described in U.S. Pat. No. 5,646,450, inventors Liles et al., issued Jul. 8, 1997. Here, a semiconductor structure is described having a first electrode and a second electrode disposed on a surface of the structure and a bridging conductor connected between the first electrode and the second electrode. The bridging conductor includes a plurality of layers of different metals wherein the plurality of layers of different metals includes a layer of refractory metal adjacent a layer of electrically conductive metal. In a preferred embodiment, the refractory metal is titanium and the electrically conductive metal is gold. With such an arrangement, a semiconductor structure is provided which is effective in preventing restructuring due to mechanical stresses induced in the metal by dissimilar thermal expansion coefficients when electrical pulsing cycles (as when propagating microwave energy) the temperature of the semiconductor structure.

The inventors have recognized because most of the RF energy propagates closer to the surface of the metal interconnect layer (known as the skin effect), this is where the greatest temperature excursions and cycling of the bulk copper will occur and be a source of microwave transmission line failure. For example the skin depth for a 5 GHz signal is approximately 1 micron for bulk copper. Since most of the RF energy propagates closer to the surface this is where the greatest temperature excursions and cycling of the bulk copper will occur and be a source of microwave transmission line failure.

More particularly, the inventors have recognized that a single strip conductor can formed as multi-layer stack specifically designed with prevent electro-migration of the Cu metal wire under high power applications. In accordance with the disclosure, the inventors use a thin electrically conductive barrier layer (typically used for adhesion and to prevent Cu diffusion), and the thicker Cu layer (used for carrying current) and design a structure of stacked barriers and Cu layers such that the barrier layer also serves to prevent restructuring of the Cu (in addition to preventing Cu diffusion.

Thus, in accordance with the disclosure, a microstrip transmission line is provided comprising: a dielectric structure; and, a strip conductor disposed over the dielectric structure, the dielectric structure having open ended trench therein. The strip conductor is disposed in the trench. The strip conductor comprises a plurality of stacked metal layers disposed in the trench. The stacked metal layers have disposed on bottom and sidewalls thereof conductive barrier metal layers.

In one embodiment, each metal stack in the strip conductor is comprised of a thin conductive barrier layer (which itself may be a plurality of thin metal layers) followed by a thicker layer of Cu.

In one embodiment, a semiconductor structure is provided comprising: a semiconductor layer having an active device therein; a dielectric structure disposed over the semiconductor layer, such dielectric structure having open ended trench therein; an electrical interconnect level disposed in the trench and electrically connected to the active device; a plurality of stacked metal layers disposed in the trench; wherein such stacked metal layers have disposed on bottom and sidewalls thereof conductive barrier metal layers.

Thus, while the upper most metal interconnect for layer M3 of the MMIC of FIG. 1 is formed as a homogenous Damascene copper conducting interconnect layer, in accordance with one embodiment of the disclosure, this upper Damascene for stage or level M3 copper metal interconnect layer is formed as a stack of Damascene interconnect layers, each Damascene interconnect layer having a thin copper layer between a pair of barrier seed layers for the copper in the copper layer thus reducing the temperature fatigue of this Damascene metal interconnect metal for stage or level M3 of FIG. 1. Further, the inventors have recognized that the Damascene process may therefore be all the way from bottom via (Via-0) metal interconnect layer of the MMIC (FIG. 1) through to last Cu Metal interconnect stage or level (M3) and that the barrier seed layers can be used to control metal restructuring. Thus, the inventors have recognized that replacing the solid thick interconnect metal stage or level M3 of un-interrupted copper with a plurality of thinner stacks of barrier layers and copper layers (each one of the layers having a lower barrier metal layer) that the power handling power of the upper metal interconnect layer under extreme temperature cycling as when carrying microwave energy may be improved. Thus, the inventors have recognized that the Damascene process already used to form a single metal interconnect for each stage or level can be used as a sequence of a plurality of individual Damascene processes to form each metal interconnect as a stack of thinner metal layers itself thereby improving the power handling power of the upper metal interconnect layer under extreme temperature cycling as when carrying microwave energy.

In one embodiment, a similar multi-layer structure could be formed in a single step trench through repeated deposition stacks of barrier metal and Cu in that trench followed by a single CMP step following metal deposition.

In one embodiment, the metal layers are copper.

In one embodiment, the barrier layer is Ta, TaN, TiN or combination thereof.

In one embodiment the dielectric structures is aluminum nitride.

In one embodiment, an electrical interconnect structure is provided having: a pair of vertically positioned, horizontally disposed, dielectric structures, each one of the dielectric structures having a plurality of open ended trenches therein, each one of the trenches in at least one of the dielectric structures including therein an electrical interconnect level having a lower portion thereof terminating in an upper portion of an electrically conductive via passing through a lower one of the dielectric structures to interconnect with an electrical interconnect level in a trench in the lower one of the dielectric structures, and wherein said electrical interconnect level at least one of the dielectric structures comprises a plurality of metal layers, each one of the metal layers having a barrier metal on side walls thereof.

In one embodiment, a structure is provided having: a pair of vertically positioned dielectric structures, an upper one of the dielectric structures having an open ended trench therein and a lower one of the pair of dielectric structures having an electrically conductive via passing there through; and an electrical interconnect disposed in the open ended trench, the electrical interconnect level having a lower portion terminating in an upper portion of the electrically conductive via, the electrical interconnect level a plurality of metal layers, each one of the metal layers having a barrier metal on side walls thereof.

In one embodiment, a semiconductor structure is provided having: a semiconductor layer having an active device therein; a dielectric structure disposed over the semiconductor layer, such dielectric structure having open ended trench therein; an electrical interconnect level disposed in the trench and electrically connected to the active device; a plurality of stacked metal layers disposed in the trench; wherein such stacked metal layers have disposed on bottom and sidewalls thereof conductive barrier metal layers have disposed on bottom and sidewalls thereof conductive barrier metal layers.

In one embodiment, a semiconductor structure is provided having: a semiconductor layer having an active device therein; a passive device formed over different portions of the semiconductor layer, a plurality of vertically positioned, horizontally disposed, dielectric structures over the semiconductor layer, each one of the dielectric structures having a plurality of open ended trenches therein, each one of the trenches in at least one of the dielectric structures including an electrical interconnect level electrically connected to one of the active and passive devices, wherein said electrical interconnect level in said at least one of the dielectric structures comprises a plurality of stacked metal layers, such layers have disposed on bottom and sidewalls thereof conductive barrier metal layers.

DESCRIPTION OF DRAWINGS

FIGS. 3-3L are cross sectional sketches of a portion of the MMIC chip of FIG. 3 at various stages in the fabrication thereof.

Like reference symbols in the various drawings indicate like elements.

DETAILED DESCRIPTION

Figure 2:
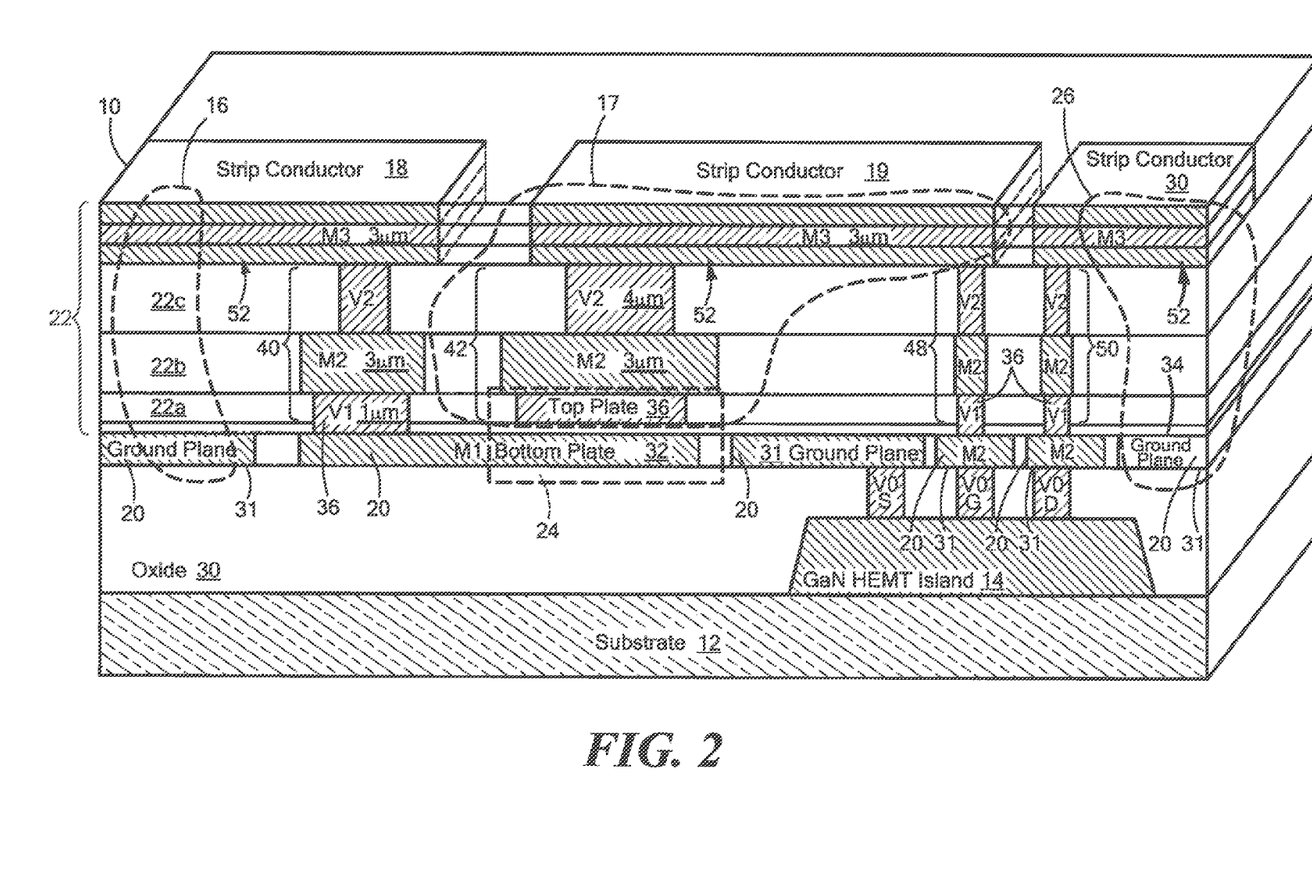
FIG. 2 is a cross-sectional, perspective sketch of an MMIC chip according to the disclosure.

Referring now to FIG. 2, a MMIC chip 10 is shown having a substrate 12, here for example silicon, and a Field Effect Transistor (FET) 14, here a GaN FET, formed on the surface on the substrate 12. Here, for example, microwave energy is fed through an input microwave transmission line 16, here a strip transmission line having a strip conductor 18 separated from a ground plane conductor 20 by a dielectric structure 22 (to be described), to the gate electrode (G) of an amplifier GaN FET through a capacitor 24, here for example, a Metal Insulator Metal (MIM) capacitor and a microwave transmission line 17, here a strip transmission line having a strip conductor 19 separated from a ground plane conductor 20 by a dielectric structure 22; the FET 14 having a grounded source electrode (S); the drain electrode (D) being coupled to an output microwave transmission 26, here a strip transmission line having a strip conductor 30 separated from the ground plane conductor 20 by the dielectric structure 22, as indicated. It should be noted that the output microwave transmission 26, may be combined with the outputs produced on the output transmission lines of several FETs, not shown, at a single point before going off chip 10.

The dielectric structure 22 is formed, together with metal structures, to be described using a Damascene process modified as described below to increase the current handling capacity of the a metal interconnect layer M3 providing the microwave transmission lines 16, 17 and 26 interconnecting the FET and the capacitor 24 and other passive and active elements, such as thin film resistors and spiral inductors, not shown.

More particularly, a first dielectric 30, here for example silicon nitride ($SiN_x$) stop etch layers and silicon oxide ($SiO_x$)(trench forming) layers, is deposited and processed using conventional photolithographic-etching techniques to form open trenches 31 having a conductive barrier metal, not shown, (for example, Ta, TaN, TiN or combination thereof) formed on bottom and sidewalls of the trenches 31 with copper on the conductive barrier metal using any Damascene process to form the first metal level M1, here for example copper with a thickness of 0.7 micrometers providing the ground plane conductor 20, the bottom plate 32 of the capacitor 24 and the vias V0, here for example copper with a thickness of ranging from 0.4 to 1.0 micrometers, connected to the source (S), drain (D) and gate (G) electrodes of the FET 14, as shown. Next, the dielectric layer 34 for the capacitor 24 is deposited over the surface of the structure.

The process continues with the formation of the first dielectric layer 22a of the dielectric structure 22 with open trenches 36 which are also etched through portions of the dielectric layer 22a to form the top metal plate of the capacitor 36 (into which Cu is subsequently deposited) 24. The open trenches 36 have a conductive barrier metal, not shown, formed on bottom and sidewalls of the trenches 36 with copper on the conductive barrier metal using any Damascene process to form via V1. The Via 1 etch is separate from the top plate capacitor etch 36. It is noted that V1 metal provides a portion of a connection 40 between the strip conductor 18 of the input microwave transmission line 16 and the bottom plate 32 of the capacitor 24; provides a portion of a connection 42 between the top plate 36 of the capacitor 24 and an a strip conductor 19 of a microstrip transmission line 17; and a portion of connection 48 between a strip conductor 19 of the microstrip transmission line 17 and electrode (G); and provides a portion of the connection 50 between the drain (D) electrode and the strip conductor 30 of the output microwave transmission line 26.

The process continues with the next dielectric layer 22b with open trenches using any Damascene process to form the second metal level M2, here for example copper with a thickness of 3 micrometers. The second metal level M2 provides a portion of the connections 40, 42 48, and 50.

In accordance with the disclosure, the process continues, as shown in more detail in FIG. 3 and to be described in connection with 3A-3L. Open trenches 64 are formed in dielectric layer 22c of the dielectric structure 22. The open trenches 64 have copper on the conductive barrier metal BLa using any Damascene process to form via V2. This is followed by the third metal layer M3, here copper, Suffice it to say here that V2 provides: another portion of the connections 40, 42, 48 and 50. The third metal layer M3 provides the strip conductors 18, 19 and 30, as shown.

Figure 3:
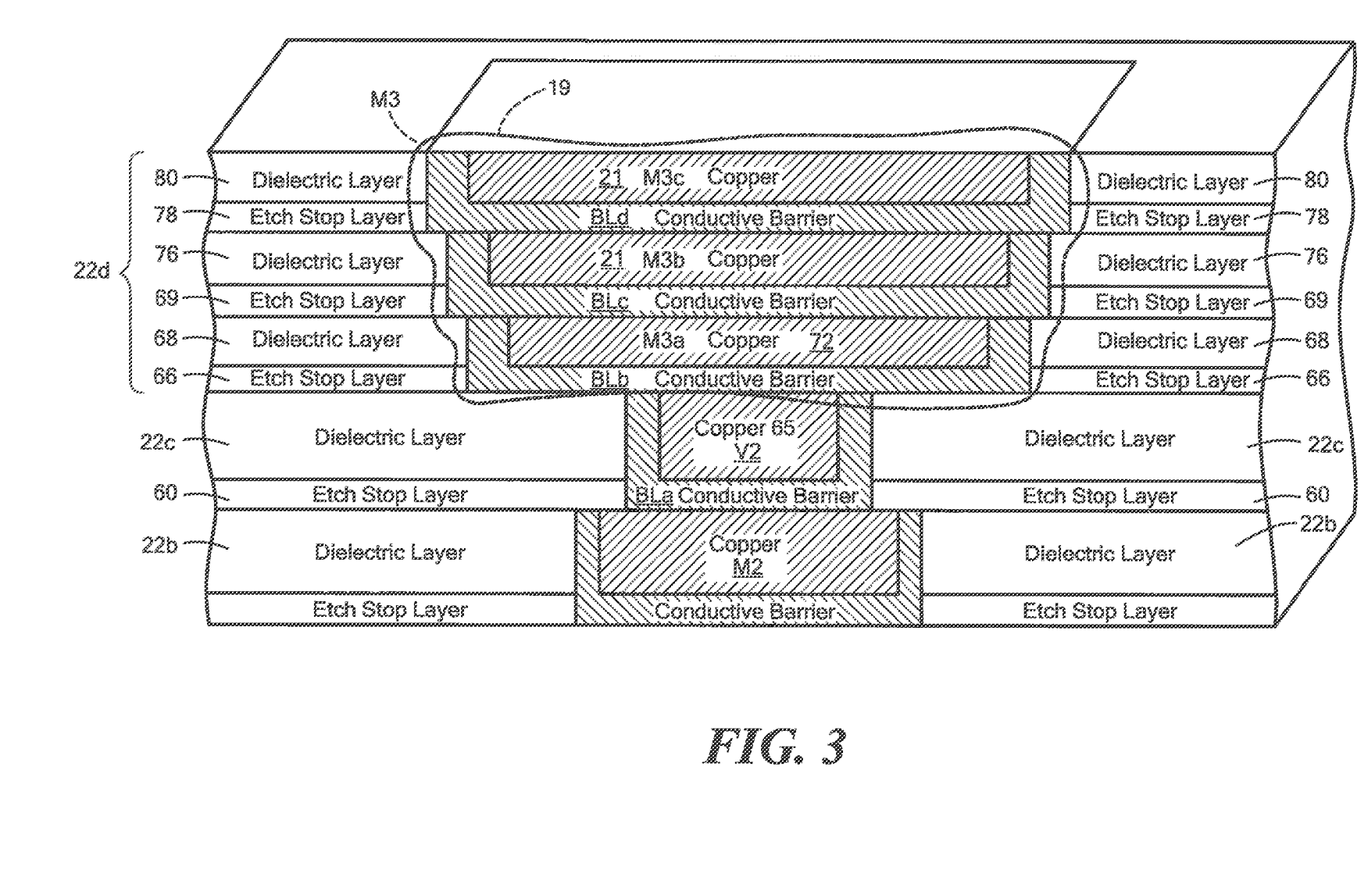
FIG. 3 is a cross-sectional, perspective sketch of an enlarged portion of the MMIC chip of FIG. 2.
Figure 3A:
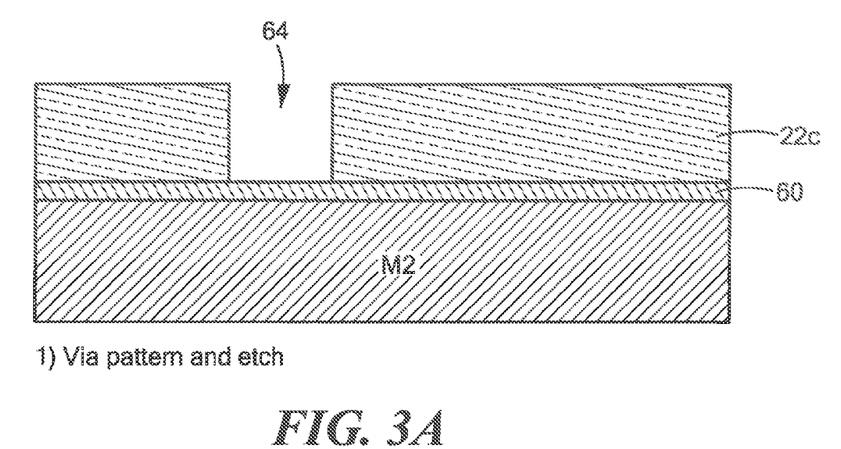

More particularly, referring also to FIG. 3, the second metal layer M2 and via V2 formed in the silicon oxide dielectric layers 22b, 22c and the third metal layer M3 is shown in more detail. It is first noted that while the second metal layer M2 and via V2 have only one solid layer of copper (this also being the case for the first metal layer M1 and vias V1 and V0), the third metal layer M3 has a plurality of, here for example three, stacked metal layers, M3a, M3b and M3c of copper each one of the three stacked metal layers M3a, M3b and M3c having a thickness for example of 1 micron. On the bottom and sidewalls thereof conductive barrier metal layers BLa, BLb and BLc, respectively, here, for example, Ta, TaN, TiN or combination thereof one of the barrier metal layers each having a thickness of 0.005-0.3 microns, as shown. The conductive barrier layers BLa, BLb and BLc, for example, may be deposited by sputtering and/or atomic layer deposition (ALD). The conductor metal layers M3a, M3b and M3c, here copper, could be deposited by sputtering or plating or a combination thereof.

As noted above, the metal layer M2 and via V2 are formed using a conventional Damascene process where a silicon nitride etch stop layer is deposited prior to the deposition of the silicon oxide dielectric layer so that the etching process used to form the open trench therein will stop at the silicon nitride etch stop layer and, after forming the open trench, have the bottom and side walls deposited thereon a conductive barrier metal. The structure then has copper deposited over it with portions of the copper passing into the trenches and more particularly onto the conductive barrier metal. The portions of the copper on the upper surface are removed by typically using chemical mechanical processing (CMP) to produce M2 and V2, as shown.

Thus, after forming metal layer M2, and referring also to FIG. 3A, a silicon nitride etch stop layer 60 is deposited over the surface of the structure. Next, a dielectric layer structure 22c of dielectric layer structure 22 is formed, here SiOx, is deposited over the etch stop layer 60. An open trench 64 (FIG. 3A) is etched into a portion of the silicon oxide dielectric layer 22c where via V2 is to be formed using conventional photolithographic-etching processing.

Figure 3B:
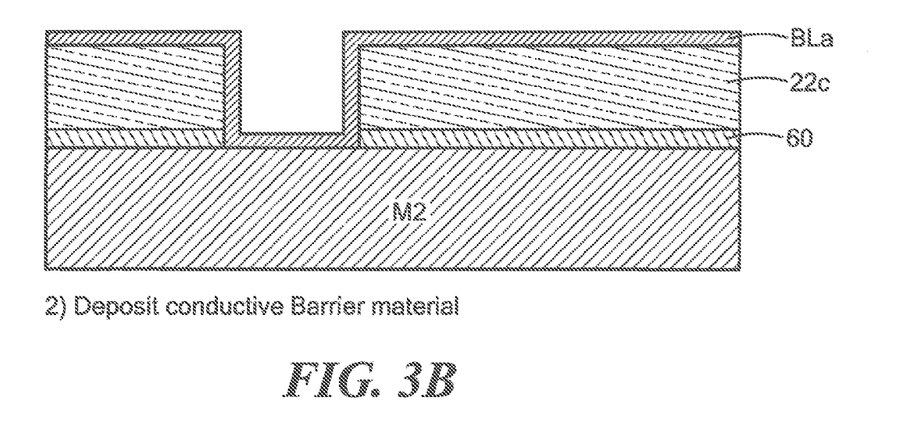
Figure 3C:
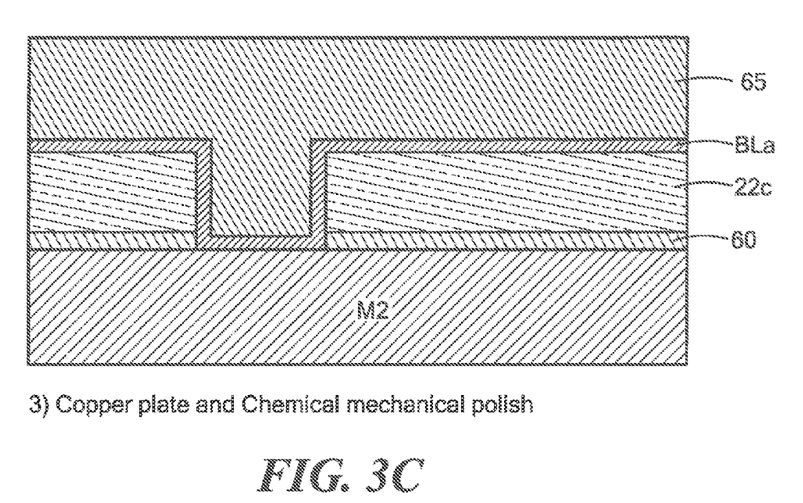
Figure 3D:
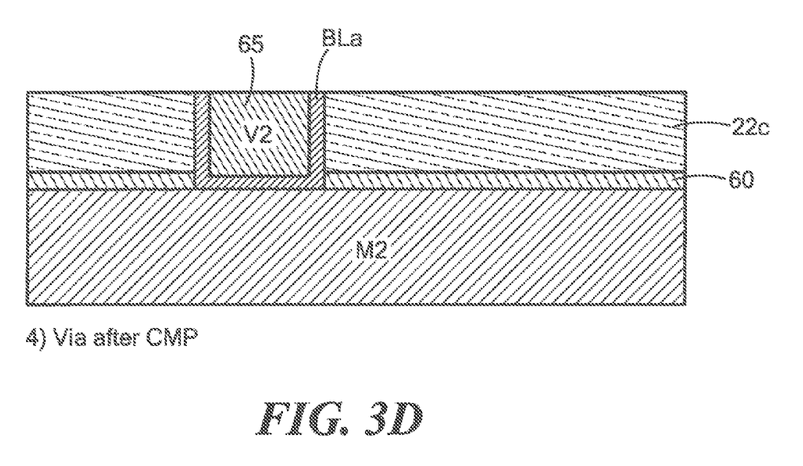

Next, referring also to FIG. 3B, the conductive barrier layer BLa is deposited as shown. Next copper 65 is deposited over the surface of the structure as shown in FIG. 3C and subsequently subjected to CMP to remove portions of the copper 65 and BLa on the upper surface of the structure thereby producing via V2 as shown in FIG. 3D.

Figure 3E:
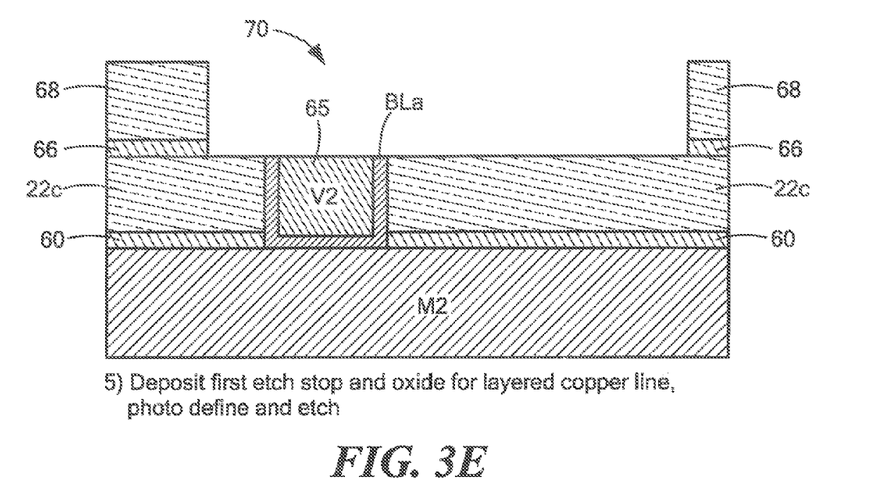

Next, an etch stop layer 66 is deposited over the surface of the structure, as shown in FIG. 3E. Next, the $SiO_x$ dielectric structure 22d portion of dielectric structure 22 is formed. As will be described, the dielectric structure 22d portion of dielectric structure 22 includes silicon oxide dielectric layers 68, 76 and 80 silicon nitride etch stop layers 69, and 78. Thus, dielectric layer 68, here SiOx, is deposited over the SiNx etch stop layer 66. An open trench 70 (FIG. 3E) is etched into a portion of the dielectric layer 68 where layer M3a is to be formed using conventional photolithographic-etching processing. It is noted that the open trench 70 is wider than the open trench 64 in FIG. 3A.

Figure 3F:
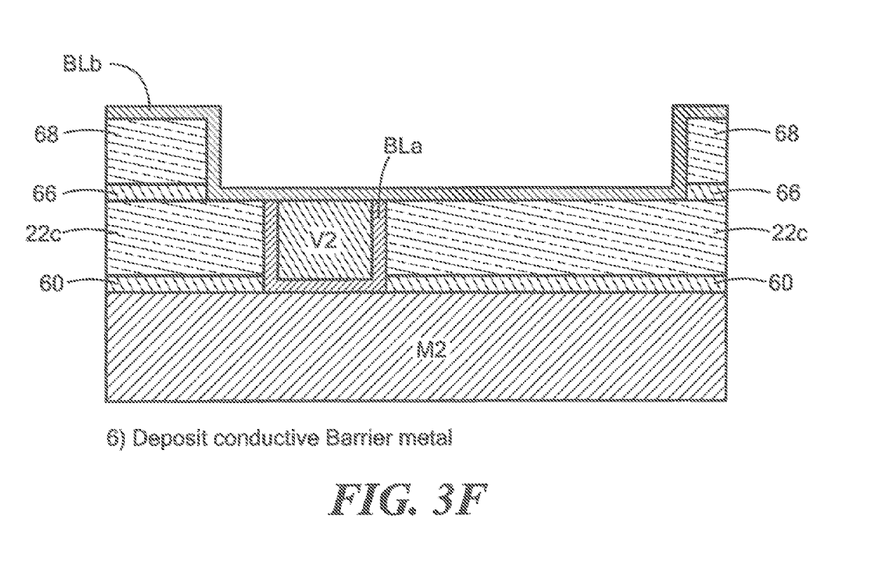
Figure 3G:
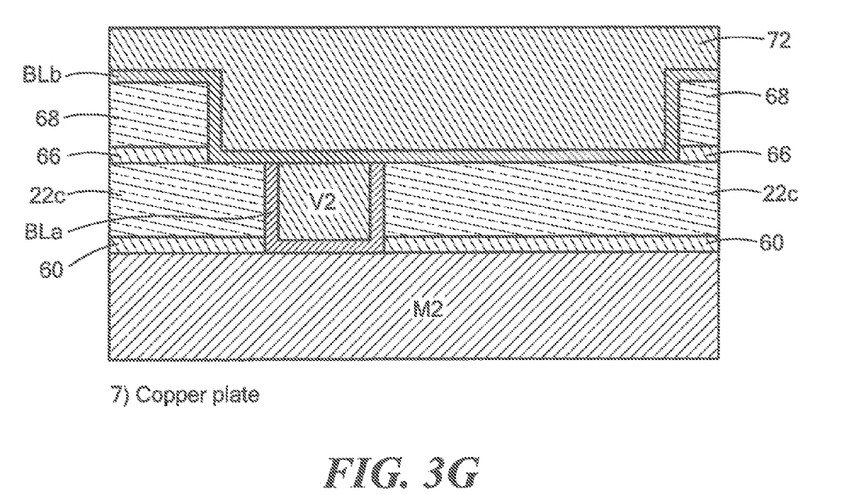
Figure 3H:
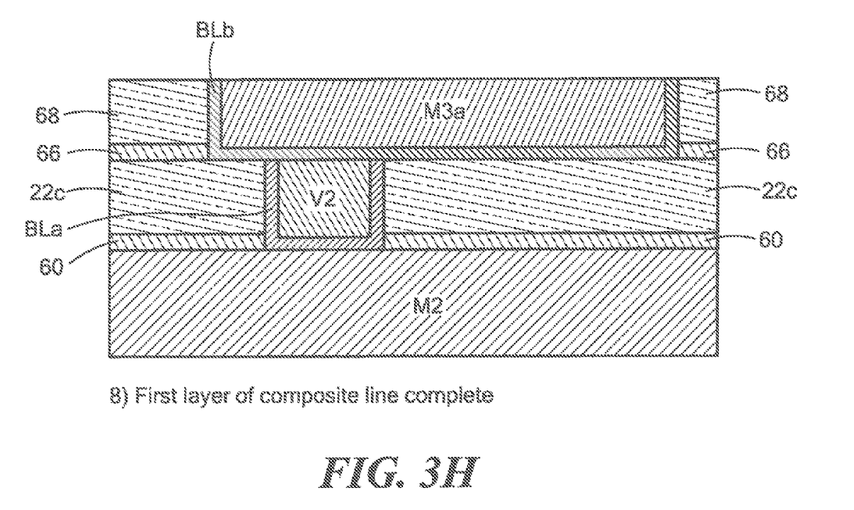

Next, referring to FIG. 3F, the conductive barrier layer BLb is deposited as shown. Next copper 72 is deposited over the surface of the structure as shown in FIG. 3G and subsequently subjected to CMP to remove portions of the copper 72 and BLb on the upper surface of the structure thereby producing metal layer M3a as shown in FIG. 3H.

Figure 3I:
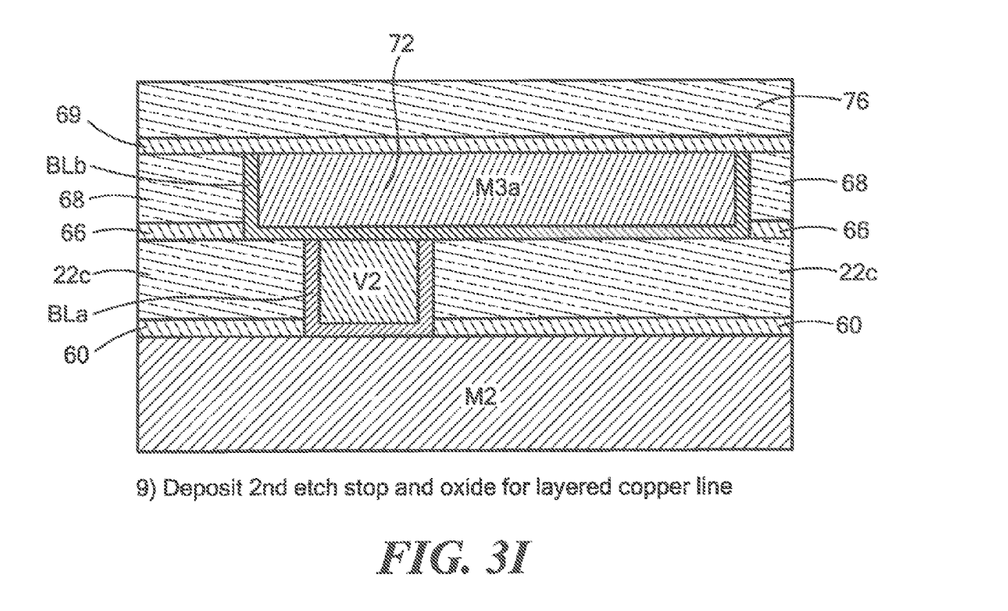
Figure 3J:
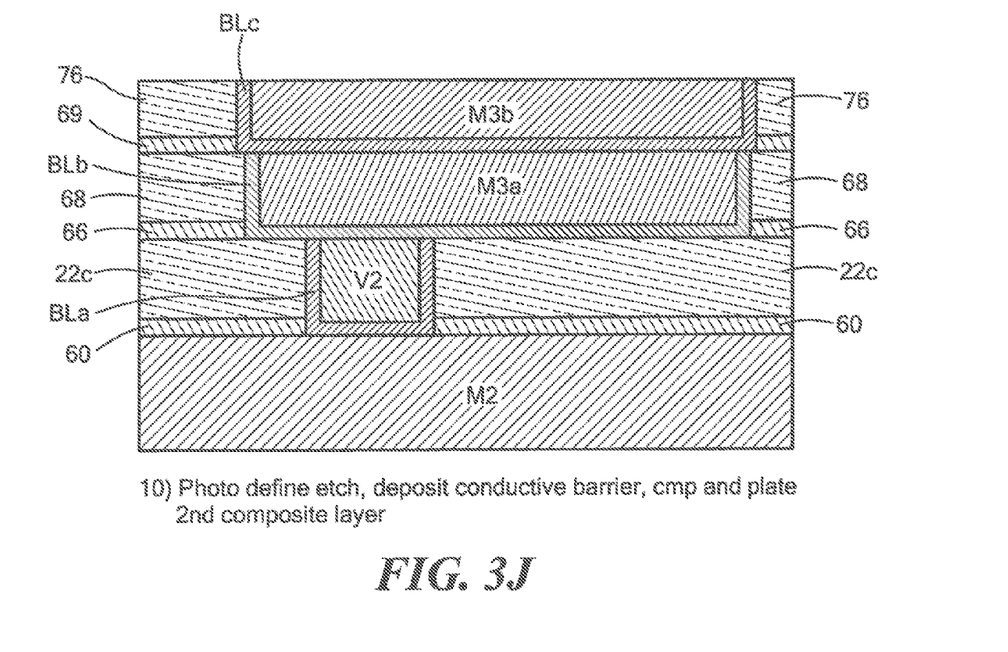

Next, a silicon nitride etch stop layer 69 is deposited over the surface of the structure, as shown in FIG. 3I. Next, a dielectric layer 76, here SiOx, is deposited over the etch stop layer 69 as shown in FIG. 3I. The process described above in connection with 3E-3H is repeated to form the conductive barrier layer BLc and metal layer M3b as shown in FIG. 3J.

Figure 3K:
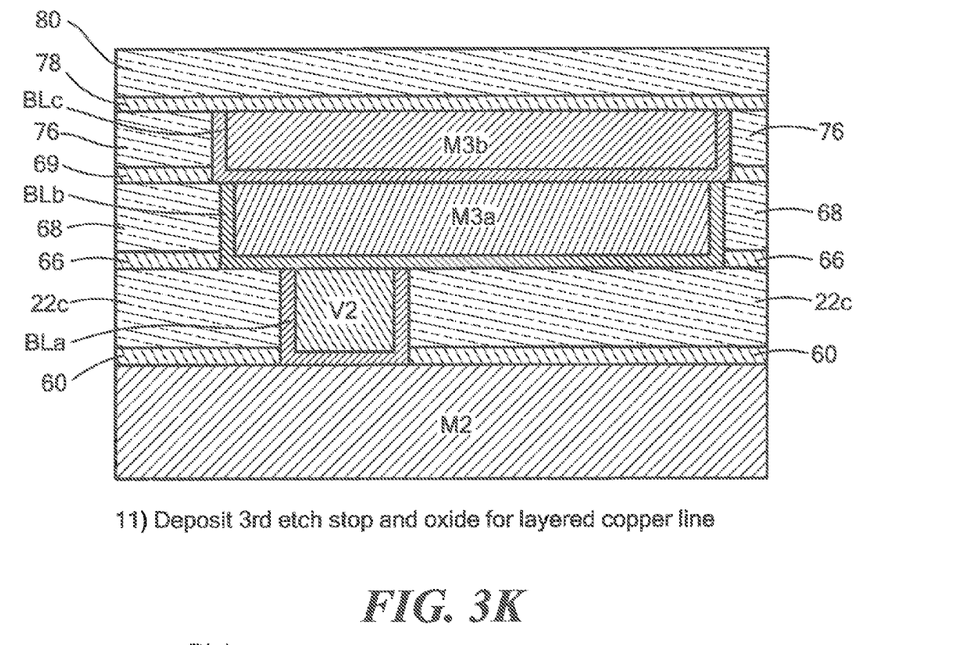
Figure 3L:
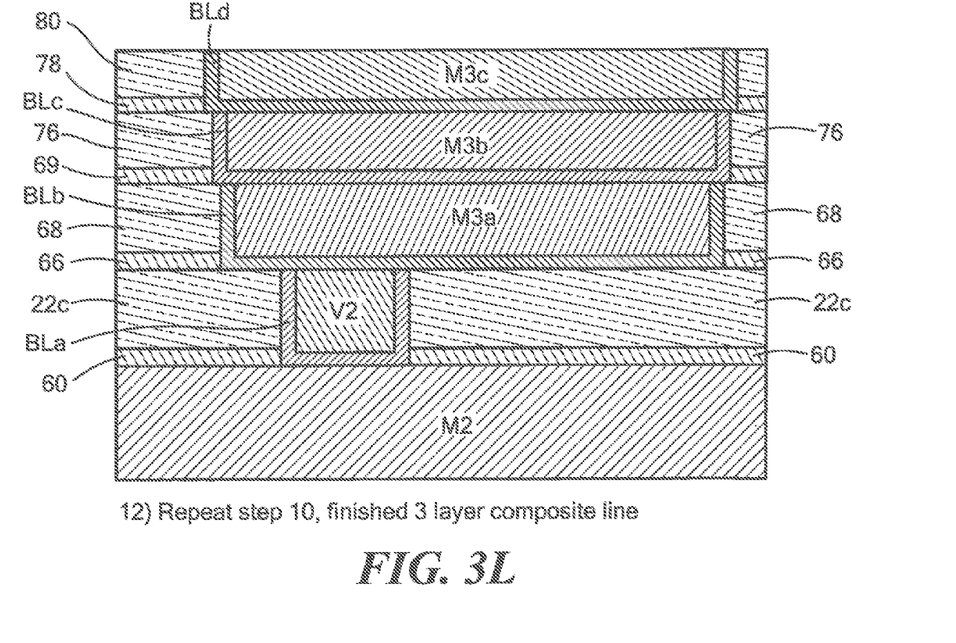

Next, an etch stop layer 78 is deposited over the surface of the structure, as shown in FIG. 3K. Next, a dielectric layer 80, here SiOx, is deposited over the etch stop layer 78 as shown in FIG. 3K. The process described above in connection with 3E-3H is repeated to form the conductive barrier layer BLd and metal layer M3c as shown in FIG. 3J, thus completing the formation of the metal layer M3 shown in FIG. 3L.

Thus, the referring again to FIG. 3, the strip conductor 19 is formed in multi-step trench 21, here the trench 21 having a side wall with three steps; one step being formed in silicon nitride etch stop layer 66 and silicon oxide dielectric layer 68; a second step being formed in silicon nitride etch stop layer 69 and silicon oxide dielectric layer 76; and the third step being formed in silicon nitride etch stop layer 78 and silicon oxide dielectric layer 80.

Figure 4A:
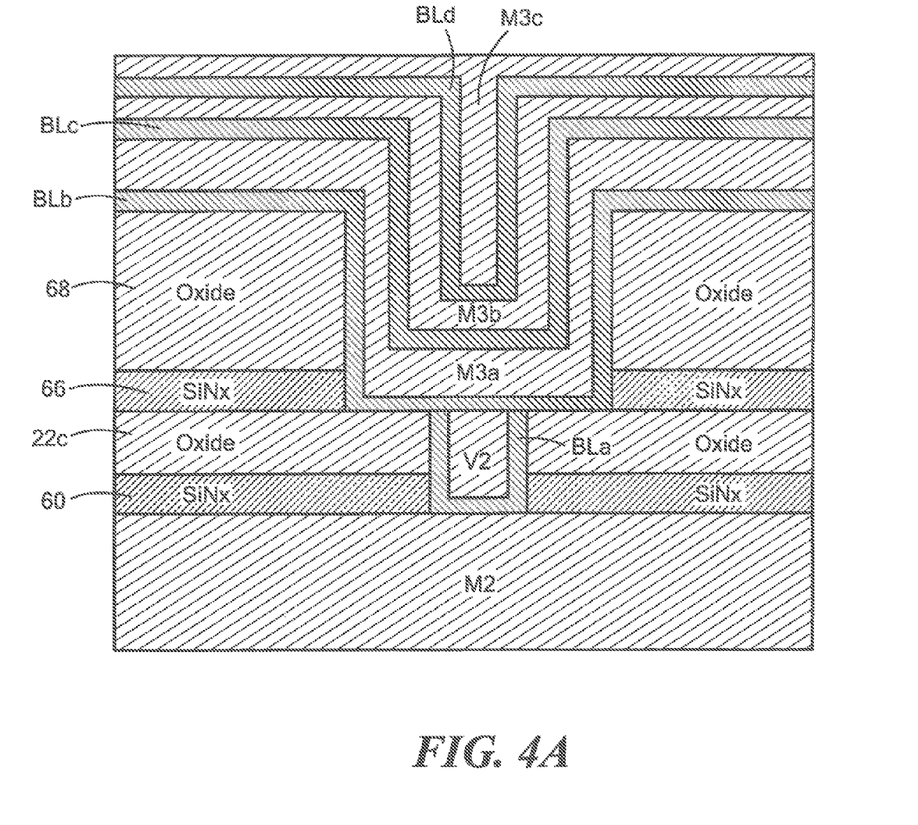
FIGS. 4A and 4B are cross sectional sketches a portion of the MMIC chip of FIG. 2A at various stages in the fabrication thereof in accordance with another embodiment of the disclosure, such processing stages taking place subsequent to the stage shown in FIG. 3E.
Figure 4B:
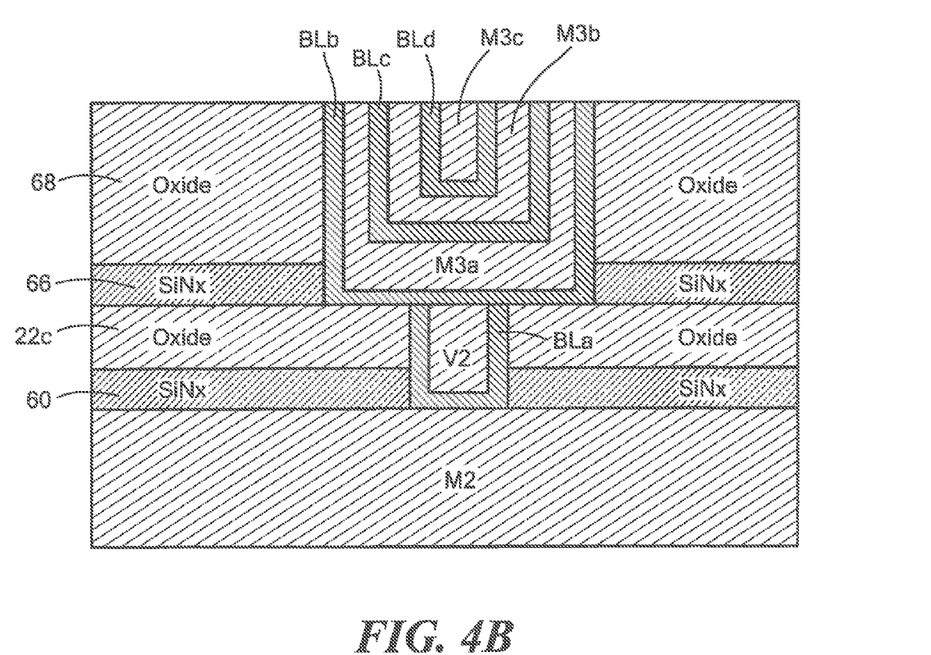

Referring now to FIGS. 4A-4B, here the metal interconnect layer M3 is formed in a single step trench. More particularly, after forming the via V2 using etch stop layer 60 and conductive barrier layer Bla as described above in FIG. 3E, a single step trench is formed in silicon oxide dielectric layer 68 as shown in FIG. 4A. Next multiple barrier layers Bib, BLc and Bld and multiple metal layers M3a-M3C are formed in the single step trench, as shown in FIG. 4A. The upper surface is the planarized using CMP to form the structure shown in FIG. 4B.

A number of embodiments of the disclosure have been described. Nevertheless, it will be understood that various modifications may be made without departing from the spirit and scope of the disclosure. For example, the top metal layer may include two or more than three metal layers. Furthermore different circuit topologies (such as GaN MMICs integrated with Si CMOS circuits by wafer bonding) may require more or less levels of metal than are shown here. Additionally after final metal deposition a final SiNx and Oxide capping layer deposition are typically performed followed by final interconnect formation for packaging or test. Further, dielectric layers other than SiOx or SiNx (for example aluminum nitride) may be used. Finally, the ground plane shown as part of FIG. 1 could be in alternative configurations. For instance, the ground plane could be placed on the backside of the wafer and connected to the frontside by backside vias in a microstrip configuration, or the ground plane could be in plane with the signal line in a coplanar waveguide (CPW) configuration.

Accordingly, other embodiments are within the scope of the following claims.

What is claimed is:

1. A microwave transmission line structure, comprising:
    a substrate;
    a semiconductor layer disposed over a first portion of the substrate, the semiconductor layer having an first electrical device formed therein;
    a second electrical device disposed over a second portion of the substrate, the second portion being laterally displaced from the first portion of the substrate;
    a dielectric structure disposed over the first portion and the second portion of the substrate;
    a strip conductor disposed over an upper surface of the dielectric structure, the strip conductor extending laterally over the first portion and the second portion of the substrate;
    wherein the dielectric structure has an open ended trench therein;
    wherein the strip conductor is disposed in the trench;
    wherein the strip conductor comprises a plurality of stacked metal layers disposed vertically in the trench;
    wherein such stacked metal layers have disposed on bottom and sidewalls thereof conductive barrier metal layers;
    wherein the strip conductor has a first bottom portion electrically connected to the second electrical device through a first electrically conductive via passing vertically through the first portion of the dielectric structure and a second bottom portion laterally displaced from the first bottom portion electrically connected to the first electrical device through a second electrically conductive via passing vertically through the second portion of the dielectric structure; and
    wherein the strip conductor carries a portion of the microwave energy between the first electrical device and the second electrical device laterally over the first portion and the second portion of the substrate.

2. The microwave transmission line structure recited in claim 1 wherein the metal layers are copper.

3. The microwave transmission line structure recited in claim 2 wherein the barrier layer is Ta, TaN, TiN or combination thereof.

4. The microwave transmission line structure recited in claim 1 wherein the first electrical device is an active transistor device and the second electrical device is a passive electrical device.

5. The microwave transmission line structure recited in claim 1 wherein each one of the plurality of stacked metal layers has a thickness approximately one micron and each one of the conductive barrier metal layers has a thickness of 0.005-0.3 microns.

6. The microwave transmission line structure recited in claim 1 including a ground plane conductor vertically separated from the strip conductor by third portions of the dielectric structure, the third portions of the dielectric structure being disposed laterally between the first portion of the dielectric structure and the second portion of the dielectric structure, wherein the ground plane conductor, the third portion of the dielectric layer and the strip conductor provide a microstrip transmission line for coupling microwave energy between the first electrical device and the second electrical device.

7. The microwave transmission line structure recited in claim 6 wherein the first electrical device is an active transistor device and the second electrical device is a passive electrical device.

8. The microwave transmission line structure recited in claim 6 wherein each one of the plurality of stacked metal layers has a thickness in the order of one micron and each one of the conductive barrier metal layers has a thickness of 0.005-0.3 microns.

* * * * *